United States Patent
Yoshikawa

[19]
[11] Patent Number: 6,157,897
[45] Date of Patent: Dec. 5, 2000

[54] APPARATUS FOR MONITORING VENTILATION OF INTEGRATED CIRCUITS IN ELECTRONIC APPARATUS

[75] Inventor: Minoru Yoshikawa, Tokyo, Japan

[73] Assignee: NEC Corporation, Tokyo, Japan

[21] Appl. No.: 09/015,910

[22] Filed: Jan. 30, 1998

[30] Foreign Application Priority Data

Jan. 31, 1997 [JP] Japan ................................ 9-033137

[51] Int. Cl.$^7$ .................................... G01K 1/02
[52] U.S. Cl. .................... 702/132; 361/164; 361/690; 374/135
[58] Field of Search ................... 702/130, 132; 374/135, 137; 361/140, 161, 164, 688, 690

[56] References Cited

U.S. PATENT DOCUMENTS

| | | | |
|---|---|---|---|
| 4,722,669 | 2/1988 | Kundert | 417/32 |
| 4,808,009 | 2/1989 | Sittler et al. | 374/178 |
| 5,302,022 | 4/1994 | Huang et al. | 374/44 |
| 5,356,216 | 10/1994 | Jeng | 374/31 |
| 5,422,787 | 6/1995 | Gourdine | 361/697 |
| 5,477,417 | 12/1995 | Ohmori et al. | 361/695 |
| 5,612,677 | 3/1997 | Baudry | 340/584 |
| 5,649,766 | 7/1997 | Blake | 374/45 |
| 5,726,874 | 3/1998 | Liang | 363/141 |
| 5,821,505 | 10/1998 | Tustaniwskyj et al. | 219/494 |
| 5,838,187 | 11/1998 | Embree | 327/512 |
| 5,844,208 | 12/1998 | Tustaniwskyj et al. | 219/494 |
| 5,926,367 | 7/1999 | Gutierrez et al. | 361/695 |

FOREIGN PATENT DOCUMENTS

| | | |
|---|---|---|
| 36 39 435 A1 | 5/1988 | Germany . |
| 38 41 057 A1 | 6/1989 | Germany . |
| 43 30 922 A1 | 3/1995 | Germany . |
| 64-61998 | 3/1989 | Japan . |
| 2-148296 | 6/1990 | Japan . |
| 4-295223 | 10/1992 | Japan . |

OTHER PUBLICATIONS

Karou, T., *Patent Abstracts of Japan*, vol. 014, No. 458, Oct. 3, 1990.
Hironori, T., *Patent Abstracts of Japan*, vol. 014, No. 345, Jul. 26, 1990.
Nobuhisa, T., *Patent Abstracts of Japan*, vol. 017, No. 110, Mar. 8, 1993.
"La Sècuritè Thermique Par Mesure De Flux D'Air," *Actualitè–Technologies*, No. 1, p. 16, Oct. 1990.
Alba et al., "A simple Low–Cost Thermistor–Based, Local Air–Velocity Mapping Method", IEEE, 1988.
Manno et al., "Effect of system Orientation and Cooling Mechanism on Component Thermal Impedances in an Electronic Enclosure", IEEE, 1990.

*Primary Examiner*—Patrick Assouad
*Attorney, Agent, or Firm*—Whitham, Curtis & Whitham

[57] ABSTRACT

A temperature IC is mounted to a card mounted within an electronic apparatus for monitoring airflow rate around the card to provide an alarm signal. The temperature IC includes a first IC including a temperature sensor and a second IC disposed downstream of the first IC. The second IC includes a temperature sensor and a resistor as a heating element. The second IC includes a first arithmetic unit that forms the difference in temperature out of two inputs of the temperature sensors, and a second arithmetic unit that determines thermal resistance of the second IC out of the difference in temperature and the quantity of heat released from the resistor. A memory stores date indicative of a relation between values of airflow rate and values of thermal resistance. A third arithmetic unit is provided to refer the stored data using the determined thermal resistance to find airflow rate.

16 Claims, 3 Drawing Sheets

APPARATUS FOR MONITORING VENTILATION OF INTEGRATED CIRCUITS IN ELECTRONIC APPARATUS

BACKGROUND OF THE INVENTION

1. Field of the Invention

The present Invention relates to an apparatus for monitoring ventilation or integrated circuits in an electronic apparatus.

2. Description of the Related Art

In order to protect integrated circuits in an electronic apparatus against thermal damage, it is the common practice to ventilate, by a fan, a space within an electronic apparatus where integrated circuits are disposed. To monitor the ventilated state of the space, it is known to measure, by a is temperature sensor, temperature at an appropriate point within the space. The measure of temperature is compared with a predetermined upper limit in temperature. A command is issued to suspend operation of the electronic apparatus when the measure of temperature reaches the predetermined upper limit. This art is described as conventional in JP-A 4-295223. According to JP-A 4-295223, this conventional art involves a potential problem that no alarm is produced before the electronic apparatus stops its operation and thus there is no time to store data beforehand.

To solve this problem, JP-A 4-295223 teaches comparing the measure of temperature with a warning temperature value that is lower than the predetermined upper limit and producing an alarm when the measure reaches the warning temperature value. It also teaches measuring speed of a ventilation fan and airflow rate or speed upstream of the fan with respect to flow of air passing through the space. The measures of the fan speed and the airflow rate or speed are processed in a predetermined logic to produce two different pieces of information regarding causes of the temperature rise in the space. According to the logic, when the measure of fan speed drops below a predetermined value, an alarm is produced that the fan is in trouble, and when the measure of airflow rate or speed drops below a predetermined value, another alarm is produced that an air filter is plugged.

U.S. Pat. No. 5,477,417 teaches the use of an integrated circuit (IC) device including a built-in positive temperature coefficient (PTC) thermistor. The thermistor is disposed near an integrated circuit chip that releases heat in operation. The thermistor exhibits a characteristic that its resistance changes in response to a change in temperature. The IC device includes an abnormal temperature signal output chip. This chip includes an inverter gate and a fixed resistor that is connected between a terminal on which a source of voltage is impressed and one end of the thermistor. The other end of the thermistor is connected with a terminal that is grounded. An input end of the inverter gate is connected with an intermediate point between the thermistor and resistor. The other or output end of the inverter gate is connected with a terminal that is used as an output terminal. When the temperature to which the thermistor is exposed becomes a preset temperature value, a potential on the output terminal changes from its high level (ON) to its low level (OFF). This U.S. patent also teaches an electronic apparatus that has mounted in a frame thereof a number of printed circuit boards. A large number of IC devices are mounted on each of the printed circuit boards. Among them, some are IC devices with a built-in thermistor. Fans are mounted to a rear panel attached to the frame and an air inlet duct is formed in a front panel attached to the frame. A plurality of airflow paths is defined within the frame between the air inlet duct and the fans. A controller and an alarm unit are arranged in the frame. The controller is programmed to cause the alarm unit to produce alarm signal and a fan driver to increase speed of the fans when it determines that potential at one or more of the thermistor built-in type IC devices indicates abnormally high temperature. It is proposed to effect reduction in operation clock frequency of a CPU when it is determined that the temperature has reached abnormally high value.

Let us now consider an IC ventilation monitoring apparatus where a temperature sensor is so disposed as to detect temperature on downstream side, with respect to flow of ventilated air, within a casing and an integrated circuit within the casing includes a static random access memory (SRAM). SRAM generates small quantity of heat as compared to quantity of heat generated by the whole system. But, it has small package size and heat capacity, increasing possibility that temperature of SRAM becomes excessively high. Thus, the above-mentioned monitoring apparatus cannot detect the abnormal event of SRAM.

Let us next consider another IC ventilation monitoring apparatus where temperature sensors, in the form of IC, are mounted on an integrated circuit device. In this case, in order to protect the integrated circuit device against thermal damage, highly accurate anticipation or information is required to determine the number and mount sites of temperature sensors and limit temperature values.

If a temperature sensor is disposed on the discharge side of an integrated circuit device, what is monitored is temperature of the overall stem. Thus, a limit temperature value is set after considering an allowable increase of temperature of the overall system. The ambient temperature and the total load on the system determine the increase of internal temperature of the system. Thus, a relatively high temperature value is set, as the limit temperature value, after considering a great contribution made by a CPU, which generates a large quantity of heat, to an increase in the system internal temperature.

Suppose that a CPU and a SRAM are mounted to different cards, respectively, and the path for inflow of cooling air to the SRAM mounted card is plugged, causing an abnormal event that the internal temperature of this card becomes excessively high to induce thermal damage. This abnormal event cannot be detected if the relatively high temperature value is set as the reference temperature of the temperature sensor.

This problem remains unsolved ever if a temperature sensor is mounted adjacent an integrated circuit, such as a CPU, with a large heat generating capability so as to monitor its temperature. This arrangement of the temperature sensor poses another problem that since it is less tall than a CPU with heat dissipating fins, the temperature sensor cannot monitor temperature of air having past the CPU.

The temperature of air having past a CPU varies with its ambient temperature and load, making it very difficult to set a limit temperature value, with which a measure of temperature is compared. The temperature of air having past around the CPU alters considerably in response to a change in mode in which the CPU operates. Suppose that the flow rate of air is considerably lower than a level expected and the load on the CPU is low so that the temperature of air having past around the CPU stays lower than the limit temperature value. This ventilation environment may allow an increase in internal temperature of the adjacent SRAM to a level causing its thermal damage, leaving this abnormal event occurring in the SRAM undetected.

Protecting all of the integrated circuits requires a number of temperature sensors to be mounted on a card. However, the other integrated circuits on the card make it difficult for such temperature sensors to be disposed at their appropriate positions.

Let us now consider what must be accounted in protecting integrated circuits within an electronic apparatus if counting the number of pulses generated by a speed sensor of a fan and/or determining whether the fan locks are used in producing an alarm.

In the case where integrated circuits are highly condensed within an electronic apparatus to such a degree as to induce a great pressure loss, a plurality of fans are arranged in series with respect to the flow of air passing around the integrated circuits. According to this arrangement, even if it fails to operate, a fan continues to rotate as its blades are subject to static pressure due to the other fans.

There are cases where it is difficult to set a limit rotational speed value of the fans depending on the site at which the electronic apparatus is mounted and the layout of the integrated circus to be protected.

The fan speed is expected to have an authority over temperature where the integrated circuits are disposed. However, the relation between the fan speed and the temperature is difficult to hold in a system using a plurality of fans, making it very difficult to determine the fan speed limit value.

An object of the present invention is to provide an IC ventilation monitoring apparatus that does not require complicated work for setting a limit temperature value with which a measure of temperature is compared.

SUMMARY OF THE INVENTION

The above-mentioned object is accomplished by mounting a temperature integrated circuit (IC) to a card mounted in an electronic apparatus to monitor airflow rate therein for detecting occurrence of an event warranted for producing an alarm.

Specifically, a ventilation monitoring apparatus according to the present invention comprises a first IC that includes a temperature sensor, and a second IC disposed downstream, with respect to flow of ventilation air, of the first IC. The second IC includes a temperature sensor and a resistor as a eating element.

More specifically, the monitoring apparatus includes a first arithmetic unit that forms the difference between two inputs from the two temperature sensors, a second arithmetic unit that uses the difference and the quantity of heat released by the resistor to give a thermal resistance, a memory storing a reference data indicative of various values of airflow rate versus various values of the thermal resistance, and a third arithmetic unit that compares the thermal resistance with the reference data to determine airflow rate of ventilation air passing.

According to the embodiment, a single IC includes a temperature sensor, a memory for temporarily storing a sensor output of the temperature sensor, a resistor as a heating element and an ON/OFF switch that interrupts connection of the resistor with a power source of voltage.

According to the embodiment, there are provided a first arithmetic unit that forms the difference in temperature, measured by the temperature sensor, caused by activation of the switch, a second arithmetic unit that uses the difference and the quantity of heat released by the resistor to give a thermal resistance, a memory storing a reference data indicative of various values of airflow rate versus various values of the thermal resistance of the temperature IC, and a third arithmetic unit that determines airflow rate of ventilation air passing through an area where the temperature IC is disposed.

DETAILED DESCRIPTION OF THE INVENTION

Figure 1:
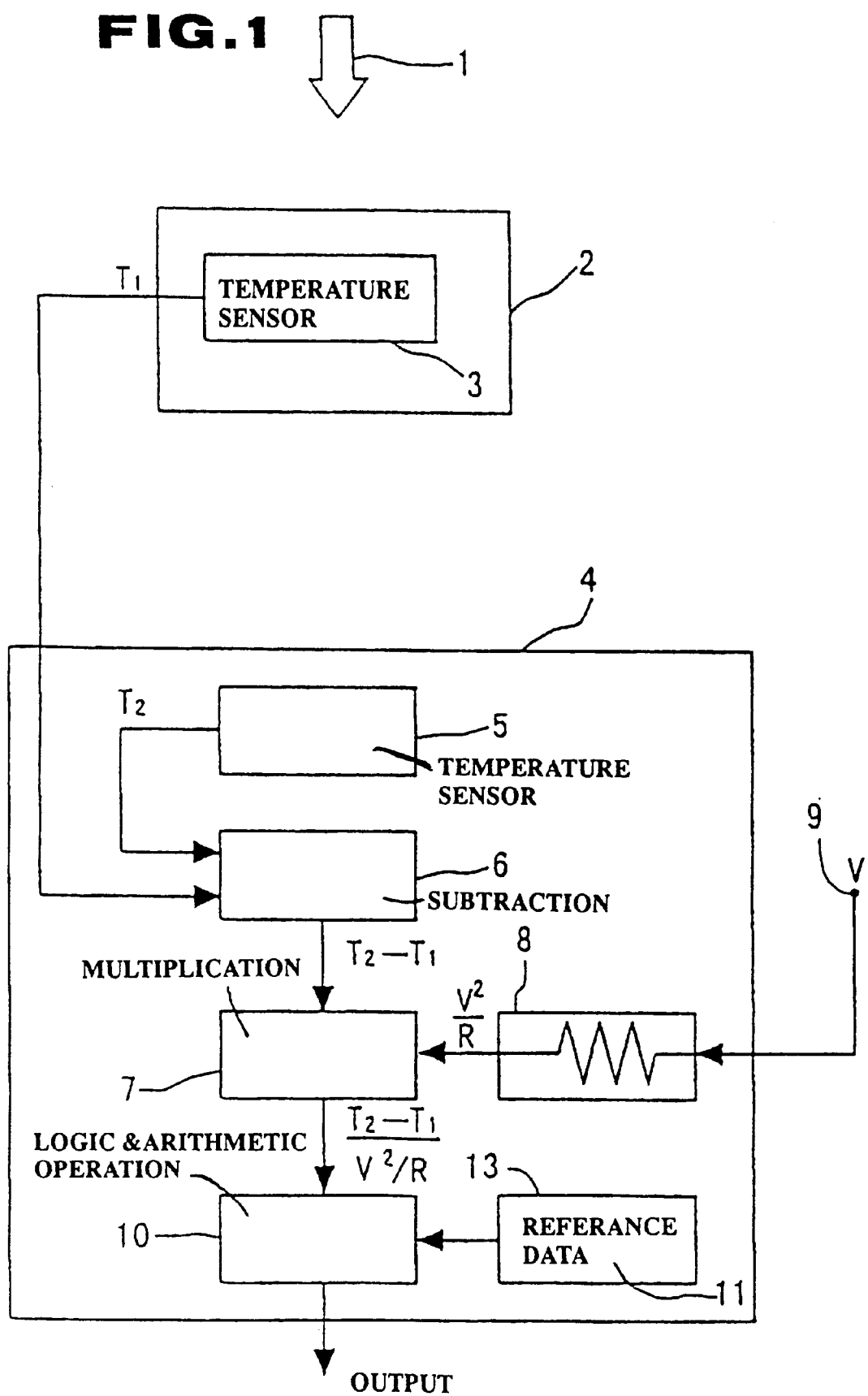
FIG. 1 is a block diagram of a first embodiment of an IC ventilation monitoring apparatus according to the present invention.

According to the preferred implementation of the present invention, there is detected an abnormal event warranted for producing an alarm wherein airflow rate passing through ambient atmosphere of an integrated circuit mounted within an electronic apparatus falls to reach a sufficiently high level. Specifically, a temperature IC is mounted to a card that is to be installed within the electronic apparatus for monitoring airflow rate for ventilation of ambient atmosphere of the card. It is determined that the abnormal event warranted for producing an alarm takes place when a measure of the monitored airflow rate is lower than a lower limit value or a predetermined window around the lower limit value. FIG. 1 shows a first preferred embodiment. In FIG. 1, an arrow 1 indicates the direction of airflow for ventilation of ambient atmosphere of a card that has mounted thereto integrated circuits to be protected against thermal damage, the integrated circuits being not shown. There are arranged a first temperature IC 2 that includes a temperature sensor 3, and a second temperature IC 4 that includes a temperature sensor 5 and an internal resistor 8. The second temperature IC 4 is disposed downstream, with respect to the direction 1 of airflow, of the first temperature IC 2. The second temperature IC 4 includes three arithmetic units, namely, a first arithmetic unit 6, a second arithmetic unit 7 and a third arithmetic unit 10. The first arithmetic unit 6 forms the difference between two inputs from the two temperature sensors 3 and 5. The second arithmetic unit 7 divides the difference by the quantity of heat generated by the resistor 8 to give a thermal resistance. A memory 13 stores a reference data indicative of various values of airflow rate versus various values of the thermal resistance. The third arithmetic unit 10 determines a value of airflow rate of ventilation air.

The principle of operation is explained. The thermal resistance of a temperature IC, such as the second temperature IC 4, which has an internal source of heat capable of generating a predetermined quantity of heat, can be determined by computation based on result of measurement of ambient temperature. The determined thermal resistance, which is the thermal resistance of a single package of the temperature IC, can be considered as a function of airflow rate of ventilation air passing through ambient atmosphere of the temperature IC. It may therefore be said that measuring temperature is noting but measuring airflow rate.

The abnormal high ambient temperature of integrated circuits within an electronic apparatus results from a shortage in airflow rate with respect to a design lower limit unless there is any abnormal temperature event of ambient temperature of the electronic apparatus. Thus, any inconvenience in ventilation within the electronic apparatus can be detected only by monitoring airflow rate passing through the ambient atmosphere of the integrated circuits to find an abnormal event warranted for producing an alarm when the monitored airflow rate drops below the design lower limit. Besides, the lower limit of airflow rate is a value that can be determined during the design cycle of the electronic apparatus, thus avoiding the conventional difficulty of setting limit values.

The following description proceeds with illustrated embodiments in the accompanying figures.

FIG. 1 illustrates, in block diagram, the first preferred embodiment according to the present invention.

According to the first embodiment, two temperature sensors IC are mounted on a card, which may be in the form of a printed circuit board. If a plurality of cards is to be mounted within the electronic apparatus, one should consider the layout of cards to be mounted within the electronic apparatus in determining the appropriate location where a card with the two temperature sensors IC should be mounted. Basically, the temperature sensors IC should be mounted to each card which integrated circuits to be protected are mounted to. However, one may restrict the number of cards to which temperature sensors IC should be mounted to such representative ones that are considered to play important role in temperature distribution within an electronic apparatus.

Subsequently, the temperature sensors IC are mounted to the card or each of the cards preferably at the most upstream portion thereof with respect to airflow within an electronic apparatus. This is necessary to avoid influence of other taller parts. However, the location where the temperature sensors IC are mounted on a card is not limited to this example and the temperature sensors IC should be mounted in the proximity of a particular integrated circuit or circuits on the card if the ambient temperature of them is to be monitored.

Referring to FIG. 1, the temperature sensors 3 and 5 may take any forms as long as they can give measures of temperature of the first and second temperature ICs. For computation of the temperature data in the subsequent stages, temperature sensor of the digital type are recommended for ease of circuit implementation rather than the analog type.

In this embodiment, temperature is measured by counting, in number, clock cycle of an oscillator because the clock cycle is proportional to temperature. In detail, the clock cycle is counted beforehand at a lower limit temperature, for example, −55° C., and at an upper limit temperature, for example, 125° C. Any temperature between the two limits can be determined with the precision below ±1° C. by interpolation of a measure of clock cycle.

The first temperature IC 2 is disposed upstream of the second temperature IC 4 with respect to the direction of airflow as indicated by the arrow 1. The second temperature IC 4 includes a resistor 8 with resistance R, which resistor 8 generates heat upon application of input voltage V by a source of voltage 9.

The quantity of heat released by the resistor 8 can be expressed as $V^2/R$. The setting is such that the quantity of heat $V^2/R$ is far greater than the consumption of electric power by logic circuit of IC. This relation can be expressed as, $$(V^2/R) \gg (\text{electric power consumption by logic}) \quad (1)$$

In view of its small heat capacity, a compact mold package is recommended for the first and second temperature ICs 2 and 4. The advantage is an appreciable rise in temperature with the small quantity of heat, resulting in a decreased error in determining airflow rate. Minimizing the influence of heat upon the printed circuit board can enhance accuracy with which the airflow rate is determined. As heat transfer coefficient through lead lines is small, Small Outline Package (SOP) or Dual Inline Package (DIP) is more preferred than a package like Ball Grid Array (BGA) for enhanced accuracy with which the airflow rate is determined.

The second temperature IC 4 is construct of, for example, a simple logic circuit. It includes, as the first arithmetic unit 6, a subtracter, and, as the second arithmetic unit 7, a multiplier. The memory 13 may take the form of a read only memory (ROM). The third arithmetic unit 10 is capable of performing operation of fractional equation including at least square root. The arithmetic units 6, 7 and 10 may be replaced with arithmetic units of another IC or software.

As shown in FIG. 1, the temperature sensor 3 of the first temperature IC 2 is disposed upstream, with respect to the direction of airflow, of the second temperature IC 4. Thus, an output signal T1 of the temperature sensor 3 indicates an inlet temperature of the second temperature IC 4. This signal T1 forms one of two inputs of the subtracter 6.

The quantity of heat released by the resistor 8 of the second temperature IC 4 can be expressed as $V^2/R$. This quantity of heat $V^2/R$ forms one of two inputs of the multiplier 7. An output signal T2 of the second temperature sensor 5 indicates temperature of the second temperature sensor IC 4 in a state where heat is released from the resistor 8. This signal T2 forms the other input of the subtracter 6.

The subtracter 6 forms difference in temperature T2−T1. An output signal T2−T1 of the subtracter 6 forms the other input of the multiplier 7. The multiplier 7 computes the following equation (2).

$$(T2-T1)/(V^2/R) \quad (2)$$

The value resulting from computing the equation (2) is called thermal resistance that has dimension of [°C./W], where W is watt. The heat radiation to the printed circuit board may be negligible. Thus, this value is a sum of the quantity of heat transferred, by heat conduction, from the resistor 8 to the outer surface of the package and the quantity of heat transferred, by heat transmission, From the outer surface of the package to the ambient atmosphere. The heat conduction portion is constant determined by materials of component parts of the IC. But, the heat transmission portion is variable with changes in the ambient air. In this embodiment, the heat transmission portion is variable with any change in airflow rate on the surface of the package.

The analysis by the inventor has revealed that the thermal resistance of the heat transmission portion is inversely proportional to the square root of the airflow rate ($\sqrt{v}$, where v is airflow rate). This relation is graphically represented in FIG. 2.

Figure 2:
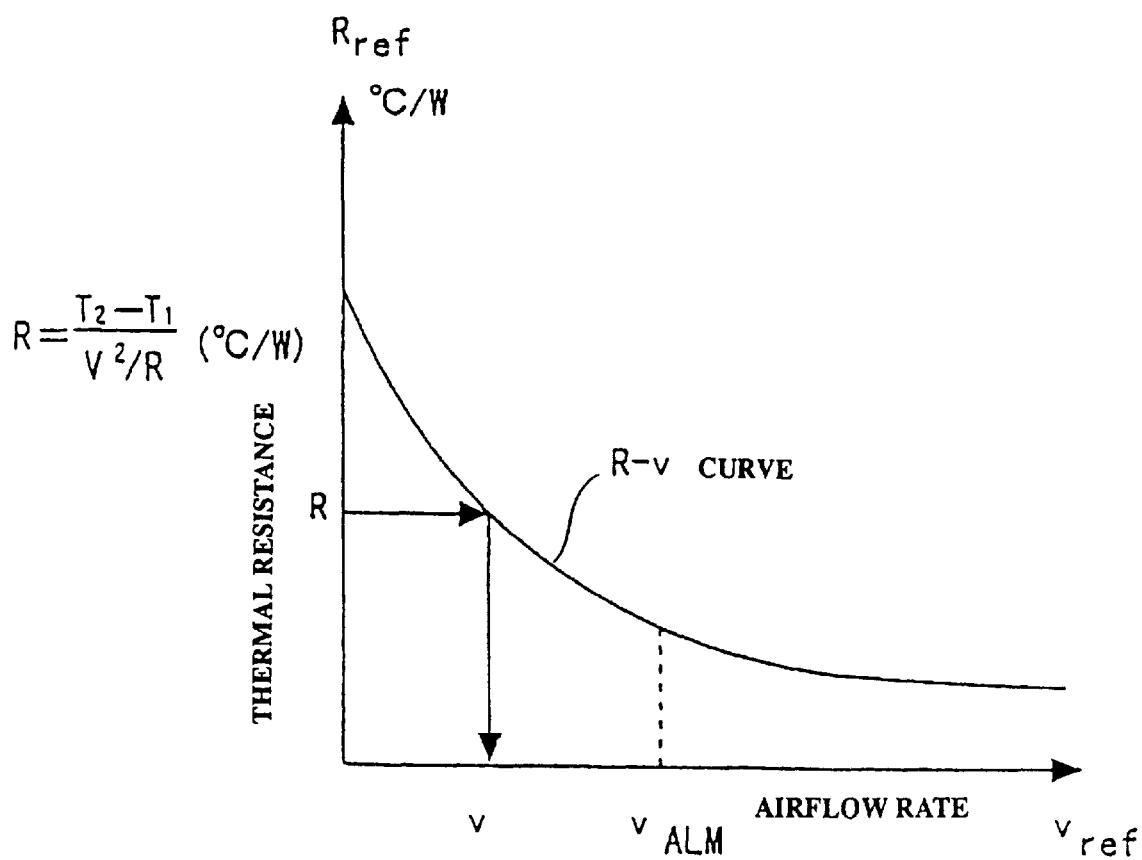
FIG. 2 is a thermal resistance vs., airflow rate characteristic curve that is stored as a reference data in a memory.

FIG. 2 is a graphical representation of a R (thermal resistance) versus v (airflow rate) characteristic curve, as one example, of the second temperature IC 4 after calibration prior to it mounting. As readily seen from this curve, the illustrated relation can be approximated by fractional function with square root. This function is a proper function that is determined by the shape of a package. Thus, calibration with respect to one after another of ICs is no longer necessary if their packages are of the same shape.

Data of the illustrated R versus v characteristic curve are stored in the internal memory 13 as the reference data 11.

In FIG. 1, an output signal of the multiplier 7 is indicative of thermal resistance $(T2-T1)/(V^2/R)$. This signal forms an input of the arithmetic unit 10. The arithmetic unit 10 compares the thermal resistance $(T2-T1)/(V^2/R)$ with the reference data 11 to find a solution of the fractional function. An output signal of the arithmetic unit 10 is indicative of airflow rate v on the surface of the package of the second thermal resistance 4.

Usually, causes of abnormal event warranted for producing an alarm are:

(1) Abnormal rise in ambient temperature of an electronic apparatus;

(2) Use of fan beyond its expected life span or in trouble that causes insufficient airflow rate within the electronic apparatus; and (3) Plugging of air inlet or outlet with paper or dust that causes no or reduced airflow within the electronic apparatus.

An operator can easily perceive the abnormally high ambient temperature, cause (1). Thus, it is easy to detect abnormally high ambient temperature of the first temperature IC 2 according to the present embodiment.

The causes (2) and (3) are closely related to insufficient airflow rate within the electronic apparatus. In thermal design of ICs, an upper limit in thermal resistance of each IC can be determined by the quantity of heat released from the IC and its guarantee temperature. This means that a lower limit in airflow rate required for protecting IC can be determined in design cycle if it package, in kind, is determined. Thus, in design cycle, lower limits in airflow rate for all of ICs to be mounted within an electronic apparatus can be readily determined.

The output signal of the second thermal IC 4 indicative of the airflow rate v is compared with the lower limit $v_{ALM}$ in airflow rate (see FIG. 2). When the former is less than the latter, an alarm is produced.

The arithmetic unit 10 may be modified to perform the function of producing an alarm signal that may be used to activate an alarm in addition to the function of producing the output signal indicative of airflow rate v. This modification can be readily accomplished by such a logic operation that normally the logic low appears as another output of the arithmetic unit, but the logic high appears as the another output when the output signal indicative of the airflow rate v drops below the lower limit. Possible appropriate measures to be taken in response to the alarm signal may be producing an alarm urging the operator to take a measure to protect the ICs or lowering the level of power to them or suspending supply of power to them.

A ventilating system is known in which a fan has variable speeds with changes in ambient temperature of an IC or a group of ICs within an electronic apparatus. The present invention may be applied to such known system. In this case, the output signal of the first temperature IC 2 indicative of T1 is used to determine a lower limit $v_{ALM}$ because the measured temperature T1 is the ambient temperature of IC to be protected.

The lower limit $V_{ALM}$ in airflow rate is determined as a predetermined function of the ambient temperature T1. According to this function, the lower limit $v_{ALM}$ is proportional to the temperature T1. The strict proportionality is not required, however. The relation required between $v_{ALM}$ and T1 may be expressed such that the lower limit $v_{ALM}$ takes one of relatively low values when the ambient temperature T1 is relatively low, while the lower limit $v_{ALM}$ takes one of relatively high values when the ambient temperature T1 is relatively high. The predetermined function or this relation may be easily determined in design cycle of each IC to be protected. Thus, what is to be done is to modify the reference data 11 in the memory 13 to introduce the determined function or relation between T7 and $v_{ALM}$.

There may occur case where the ambient temperature of IC to be protected is abnormally high even if the airflow rate is sufficiently high. This may be caused by recirculation of relatively hot discharge air into the space inside an electronic apparatus. This abnormal event that is warranted for producing an alarm may be easily detected by setting an upper limit in ambient temperature. Specifically, what is to be done is to introduce a logic that an alarm signal is produced when the output of the first temperature IC indicative of T1 reaches the upper limit that has been preset.

Figure 3:
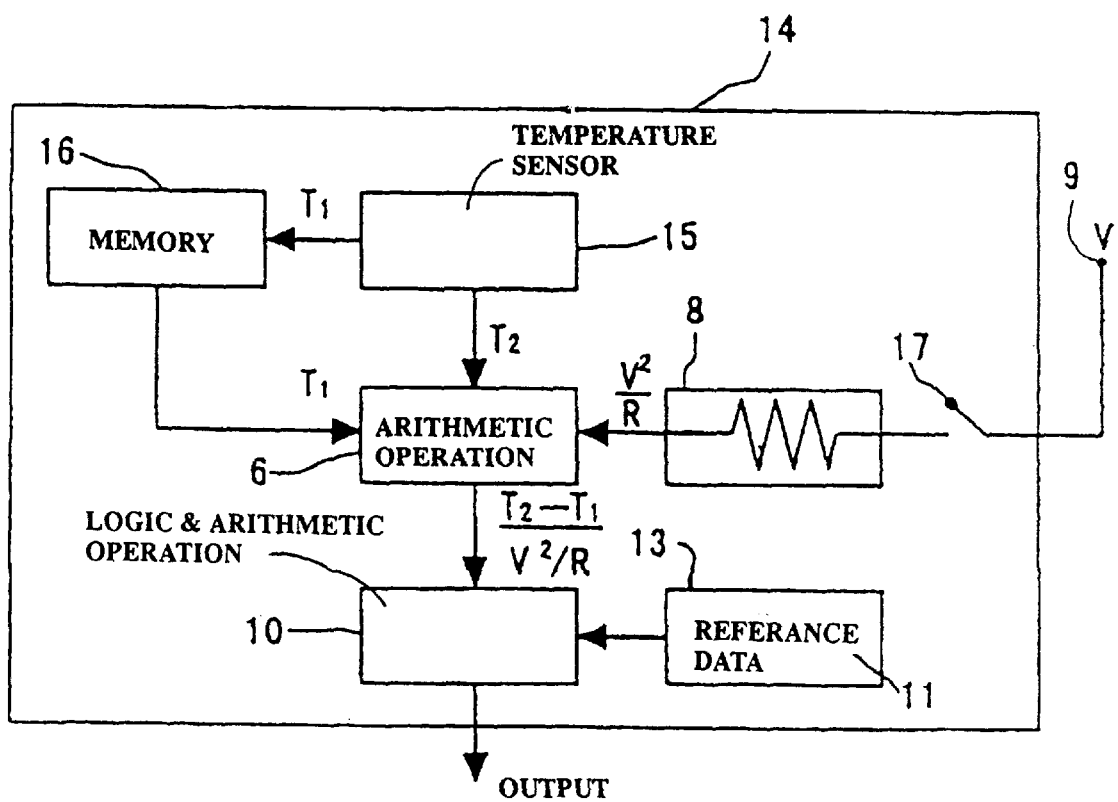
FIG. 3 is a block diagram of a second embodiment of IC ventilation monitoring apparatus according to the present invention.

FIG. 3 illustrates the second preferred embodiment according to the present invention. This second embodiment is different from the first embodiment in that a single temperature IC 14 has integrated the functions that have been performed by the first and second temperature ICs 2 and 4, respectively.

The temperature IC 14 includes a single temperature sensor 15 and a memory 16 arranged to temporarily store output signal of the temperature sensor 15.

The temperature IC 14 also includes a resistor 8 and an ON/OFF switch 17 that is disposed between the resistor 8 and a source of voltage 9. The resistor 8 is connected with the source of voltage 9 when the switch 17 is turned on and it releases heat. When the switch 17 is turned off, the connection is interrupted. Suppose the switch 17 is left turned off and there is no heat release from the resistor 8. The output signal of the temperature sensor 15 that is stored in the memory 16 under this condition is introduced as ambient temperature T1 to an arithmetic unit 6. Subsequently the switch 17 is turned on and the resistor start releasing heat, causing the output signal of the temperature sensor 15 to change to indicate gradually rising temperature. The temperature that is measured by the temperature sensor 15 reaches a stable level upon expiration of a predetermined period of time, for example, several minutes beyond ten minutes, after turning on the switch. The temperature having reached the stable level is introduced as temperature T2 to the arithmetic unit 6.

The arithmetic unit 6 uses these inputs T1 and T2 in calculating the equation (2) to determine thermal resistance. The second embodiment employs the same data proofing as explained in connection with the first embodiment after determination of the thermal resistance.

The second embodiment is advantageous over the first embodiment in its ease in finding its installation site on a printed circuit board because a single IC, which occupies less installation area, performs the functions performed by the two ICs.

What is claimed is:

1. A ventilation monitoring apparatus for protecting integrated circuits within an electronic apparatus against thermal damage, comprising a temperature integrated circuit (IC) on a card mounted in the electronic apparatus to monitor airflow rate therein for detecting occurrence of an event warranted for producing an alarm, wherein said IC comprises:
a temperature sensor;
a memory for temporarily storing a sensor output of said temperature sensor;
a resistor; and
a switch for establishing and disestablishing an electrical connection between said resistor and a power supply.

2. A ventilation monitoring apparatus for protecting integrated circuits within an electronic apparatus against thermal damage, comprising:

a first integrated circuit (IC) that includes a temperature sensor; and a second IC disposed downstream, with respect to flow of ventilation air, of the first IC, said second IC including a temperature sensor and a resistor as a heating element.

3. A ventilation monitoring apparatus as claimed in claim 2, including:

a first arithmetic unit that forms the difference between two inputs from said temperature sensors;

a second arithmetic unit that uses said difference and the quantity of heat released by said resistor to give a thermal resistance;

a memory storing reference data indicative of various values of airflow rate versus various values of thermal resistance; and a third arithmetic unit that compares said thermal resistance with said reference data to determine airflow rate.

4. A ventilation monitoring apparatus as claimed in claim 3, wherein said second IC includes said first, second and third arithmetic units and said memory.

5. A ventilation monitoring apparatus as claimed in claim 3, wherein said first, second and third arithmetic units include software.

6. A ventilation monitoring apparatus as claimed in claim 3, wherein said reference data includes a readily available calibrated data indicative of relation between thermal resistance and airflow rate.

7. A ventilation monitoring apparatus as claimed in claim 3, wherein said third arithmetic unit is operative to determine whether the input from said temperature of said first IC has reached a preset upper limit for producing an abnormal temperature alarm.

8. A ventilation monitoring apparatus as claimed in claim 1, including:

a first arithmetic unit that forms the difference in temperature, measured by said temperature sensor, caused by activation of said switch;

a second arithmetic unit that uses said difference and the quantity of heat released by said resistor to give a thermal resistance;

a memory storing reference data indicative of various values of airflow rate versus various values of thermal resistance of said temperature IC; and a third arithmetic unit that compares said thermal resistance with said reference data to determine airflow rate.

9. A ventilation monitoring apparatus as claimed in claim 8, wherein said first, second and third arithmetic units include software.

10. A ventilation monitoring apparatus for protecting integrated circuits within an electronic apparatus against thermal damage, comprising:

first and second integrated circuits (ICs), each including a temperature sensor, on a card mounted within the electronic apparatus;

said second IC being disposed downstream, with respect to ventilation air within the electronic apparatus, of said first temperature IC, said second IC including a resistor as a heating element, said second IC being operative to form the difference between two inputs from said temperature sensors of said first and second ICs, said second IC being operative to use said difference and the quantity of heat released from said resistor of said second IC to give thermal resistance of said second IC, said second IC being operative to compare said thermal resistance with a reference data indicative of a predetermined relation between various values of thermal resistance of said second IC and various values of airflow rate to determine airflow rate.

11. A ventilation monitoring apparatus for protecting integrated circuits within an electronic apparatus against thermal damage, comprising:

an integrated circuit (IC) on a card mounted within the electronic apparatus, said IC including a temperature sensor, a memory storing sensor output of said temperature sensor, a resistor as a heating element and a switch connected to said resistor;

said IC being operative to form the difference between in temperature, measured by sold temperature sensor, caused by activation of said switch, said IC being operative to use said difference and the quantity of heat released from said resistor to give thermal resistance of said IC, said IC being operative to compare said thermal resistance with a reference data indicative of a predetermined relation between various values of thermal resistance of said IC and various values of airflow rate to determine airflow rate.

12. A ventilation monitoring apparatus as claimed in claim 10, wherein said second IC is operative to provide an abnormal temperature alarm when the input from said temperature sensor of said first IC has reached a predetermined upper limit.

13. A ventilation monitoring apparatus as claimed in claim 12, wherein said IC is operative to provide an abnormal temperature alarm when the sensor output of said temperature sensor with said switch left turned off has reached a predetermined upper limit.

14. A method of monitoring ventilation around integrated circuits within an electronic apparatus, comprising the steps of:

placing a physical body with an internal heating element within an area adjacent an integrated circuit to be protected against thermal damage;

determining thermal resistance of said physical body from the quantity of heat from said heating element and the difference in temperature on said physical body caused by said heating element;

determining data indicative of a relation between values in airflow rate around said physical body and values in thermal resistance of said physical body; and referring to said determined data using said determined thermal resistance to determine airflow rate around said physical body.

15. A method of monitoring ventilation around integrated circuits within an electronic apparatus, comprising the steps of:

placing a physical body with an internal heating element within an area adjacent an integrated circuit to be protected against thermal damage;

determining thermal resistance of said physical body from the quantity of heat from said heating element and the difference in temperature on said physical body caused by said heating element;

determining date indicative of a relation between values in airflow rate around said physical body and values in thermal resistance of said physical body;

referring to said determined data using said determined thermal resistance to determine airflow rate around said physical body; and providing an alarm signal when said determined airflow rate drops to a predetermined lower limit.

16. A method of monitoring ventilation around integrated circuits within an electronic apparatus, comprising the steps of:

placing a physical body with an internal heating element within an area adjacent an integrated circuit to be protected against thermal damage;

measuring an inlet temperature of said physical body at a portion upstream of said physical body with respect to airflow within the electronic apparatus;

determining thermal resistance of said physical body from the quantity of heat from said heating element and the difference in temperature on said physical body caused by said heating element;

determining data indicative of a relation between values in airflow rate around said physical body and values in thermal resistance of said physical body;

referring to said determined data using said determined thermal resistance to determine airflow rate around said physical body;

providing a first alarm signal when said determined airflow rate drops to a predetermined lower limit; and providing a second alarm signal when said measured inlet temperature has reached a predetermined upper limit.

* * * * *